(12) United States Patent
Yamamoto

(10) Patent No.: US 7,440,736 B2
(45) Date of Patent: Oct. 21, 2008

(54) INTERMEDIATE FREQUENCY CIRCUIT FOR TELEVISION TUNER WITH IMPROVED INTERMEDIATE FREQUENCY CHARACTERISTIC

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 553 days.

(21) Appl. No.: 11/286,095

(22) Filed: Nov. 10, 2005

(65) Prior Publication Data

US 2006/0099920 A1 May 11, 2006

(30) Foreign Application Priority Data

Nov. 11, 2004 (JP) ............... 2004-006633 U

(51) Int. Cl.
*H04B 1/18* (2006.01)
(52) U.S. Cl. ............... 455/180.2; 455/188.1; 348/731
(58) Field of Classification Search ... 455/179.1–180.2, 455/188.1, 188.2; 348/729, 731
See application file for complete search history.

(56) References Cited

U.S. PATENT DOCUMENTS

| | | | |
|---|---|---|---|
| 4,063,201 A | 12/1977 | Komatsubara et al. | |
| 4,215,372 A * | 7/1980 | Suzuki | 348/731 |
| 5,523,801 A * | 6/1996 | Tanaka et al. | 348/737 |
| 6,351,294 B1 * | 2/2002 | Yamamoto et al. | 348/731 |
| 6,583,826 B1 * | 6/2003 | Sawamoto et al. | 348/731 |
| 6,864,924 B2 * | 3/2005 | Yamamoto | 348/731 |
| 6,876,401 B2 * | 4/2005 | Yamamoto | 348/729 |
| 6,876,402 B2 * | 4/2005 | Sasaki | 348/731 |
| 7,030,937 B2 * | 4/2006 | Yamamoto | 348/729 |
| 7,289,780 B2 * | 10/2007 | Yamamoto | 455/180.4 |
| 2001/0019290 A1 | 9/2001 | Hecht | |
| 2003/0181177 A1 * | 9/2003 | Katagiri | 455/188.2 |
| 2004/0058593 A1 | 3/2004 | Osada | |
| 2005/0101274 A1 * | 5/2005 | Toh et al. | 455/180.1 |
| 2005/0113051 A1 * | 5/2005 | Yamamoto | 455/180.1 |
| 2006/0063499 A1 * | 3/2006 | Miyagi | 455/179.1 |

FOREIGN PATENT DOCUMENTS

| | | |
|---|---|---|
| JP | 10-271402 | 10/1998 |
| JP | 11-069245 | 3/1999 |

OTHER PUBLICATIONS

Search Report dated Nov. 22, 2006, for corresponding European Patent Application No. 05 024 206.4.
Search Report dated Mar. 10, 2006 for corresponding European Application No. 05 024 206.4.

* cited by examiner

*Primary Examiner*—Edward Urban
*Assistant Examiner*—Adeel Haroon
(74) *Attorney, Agent, or Firm*—Brinks Hofer Gilson & Lione

(57) ABSTRACT

An intermediate frequency circuit includes an intermediate frequency tuning circuit which resonates parallel to an intermediate frequency signal, a N−1 channel trap circuit connected to the output of the intermediate frequency tuning circuit, for removing voice signal components of lower neighboring channels, an intermediate frequency amplifier connected to the output of the N−1 channel trap circuit, for amplifying the intermediate frequency signal, and an intermediate frequency signal resonance circuit connected to the output of the intermediate frequency amplifier, wherein all the components are formed on a circuit board. In this case, the coupling state of the components connected between the input and output of the intermediate frequency amplifier on the circuit board is selected, and a picture portion in a frequency characteristic of the intermediate frequency circuit is set to a peak.

3 Claims, 9 Drawing Sheets

EFFECT OF COUPLING BETWEEN COILS ON IF RESPONSE

| | 0MHz | 1MHz | 2MHz | 3MHz | 3.58MHz |
|---|---|---|---|---|---|
| REFERENCE | | -0.35 | -0.35 | -0.72 | -6.72 |

(dB)

INTERMEDIATE FREQUENCY CIRCUIT FOR TELEVISION TUNER WITH IMPROVED INTERMEDIATE FREQUENCY CHARACTERISTIC

BACKGROUND OF THE INVENTION

1. Field of the Invention

The invention relates to an intermediate frequency circuit for a television tuner, in which, when the intermediate frequency circuit for the television tuner is formed on a circuit board, the coupling state of components disposed between the input and output of an intermediate frequency amplifier is selected, and a picture portion in a frequency characteristic of the intermediate frequency amplifier is set to become a peak.

2. Description of the Related Art

In general, an intermediate frequency circuit for a television tuner formed on a circuit board includes an intermediate frequency tuning circuit, which has a coil and a capacitor connected parallel to each other and resonates parallel to an intermediate frequency signal, an N−1 channel trap circuit, which is connected to the output of the intermediate frequency tuning circuit and has a coil and a capacitor connected parallel to each other, for removing voice signal components of lower neighboring channels, an intermediate frequency amplifier connected to the output of the N−1 channel trap circuit, for amplifying the intermediate frequency signal, and an intermediate frequency signal resonance circuit connected to the output of the intermediate frequency amplifier and having a coil and a capacitor connected in series. Furthermore, in the intermediate frequency circuit for the television tuner, in order to avoid induction coupling of the coil constituting the N−1 channel trap circuit and the coil constituting the intermediate frequency signal resonance circuit as much as possible, the two coils are disposed on the circuit board so as to be orthogonal to each other.

In this case, FIG. 7 shows an exemplary construction of an intermediate frequency circuit for a television tuner according to a related art, including a front part circuit. FIG. 8 is a plan view illustrating the disposition state of main components when the intermediate frequency circuit for the television tuner shown in FIG. 7 is formed on the circuit board. In addition, the same reference numerals as in the components shown in FIG. 7 denote the same components of FIG. 8 in the description below.

As shown in FIG. 7, the intermediate frequency circuit 50 of the television tuner includes an intermediate frequency tuning circuit 51 in which two coils 51(1) and 51(2) that are connected in series are connected parallel to a capacitor 51(3), a N−1 channel trap circuit 52 in which a coil 52(1) is connected parallel to a capacitor 52(2), an intermediate frequency signal amplifier 53, an intermediate frequency signal resonance circuit 54 in which a coil 54(1) and a capacitor 54(2) are connected in series, a frequency converter 55 including a mixer circuit and a local oscillation circuit, a buffer resistor 56, a bypass capacitor 57, a coupling capacitor 58, a bypass capacitor 59, a shunt capacitor 60, an input terminal 50(I), an output terminal 50(O), and a power supply terminal 50(B). These components 51 to 60 are interconnected, as shown in FIG. 7. Furthermore, the front part circuit of the intermediate frequency circuit 50 of the television tuner includes a high frequency circuit 61 including a bandpass filter, a high frequency amplifier, a television signal select filter or the like, and a reception antenna 62 which is connected to the high frequency circuit 61 as shown in FIG. 7.

Furthermore, as shown in FIG. 8, in the disposition state of the components when the intermediate frequency circuit 50 of the television tuner is formed on the circuit board, an integrated circuit block 53,55 of the intermediate frequency signal amplifier 53 and the frequency converter 55 is disposed at the central region of the board. The integrated circuit block 53,55 has two mixer output terminals (Mix out) and two intermediate frequency input terminals (IF in) that are derived from one side, and an intermediate frequency output terminal (IF out) that is derived from another side. The two coils 51(1) and 51(2) and the coil 52(1) are disposed parallel along one side of the integrated circuit block 53,55. The coil 54(1) is disposed so as to be orthogonal to the coil 52(1). Furthermore, the capacitor 51(3) is connected to ends of the two coils 51(1) and 51(2) therebetween and the other end being directly connected to each other by a lead, thus forming the intermediate frequency tuning circuit 51. The coil 52(1) has both ends being connected to the capacitor 52(2) therebetween, thus forming the N−1 channel trap circuit 52. The coil 54(1) is connected to the capacitor 54(2) in series, thus forming the intermediate frequency signal resonance circuit 54. In addition, the respective components 56 to 60 are connected, as shown in FIG. 8, and the intermediate frequency circuit 50 of the television tuner is provided.

As described above, in the intermediate frequency circuit for the television tuner according to the related art shown in FIGS. 7 and 8, the coil 52(1) of the N−1 channel trap circuit 52 and the coil 54(1) of the intermediate frequency signal resonance circuit 54 are disposed orthogonally. The two intermediate frequency input terminals (IF in) and the two intermediate frequency output terminals (IF out) in the integrated circuit block 53,55 are disposed on opposite sides to each other. Therefore, the feedback amount between the input and output of the intermediate frequency amplifier 53 is small.

In this case, FIGS. 9A and 9B show characteristics obtained in the intermediate frequency circuit for the television tuner according to the related art shown in FIGS. 7 and 8. FIG. 9A shows a frequency characteristic and FIG. 9B shows a video frequency characteristic.

As shown in FIG. 9A, the intermediate frequency circuit for the television tuner according to the related art has a characteristic in that in the frequency characteristic, a peak level is inclined toward a carrier (C) portion than a picture (P) portion and the level of the picture (P) portion is about 0.5 dB lower than the peak level.

Meanwhile, as shown in FIG. 9B, the intermediate frequency circuit for the television tuner according to the related art has a characteristic in that in the video frequency characteristic, there are a portion that rises near 1 MHz from a reference level of 0 MHz, and a portion that abruptly declines near 3.58 MHz.

As described above, the intermediate frequency circuit for the television tuner according to the related art has a construction in which coupling between the input and output side of the intermediate frequency amplifier becomes weak when the intermediate frequency circuit for the television tuner is formed on the circuit board. Thus, the peak level and the picture portion in the frequency characteristic are not identical to each other, or there occurs a rising portion or an abruptly declined portion in the video frequency characteristic, which are not satisfactory characteristics.

SUMMARY OF THE INVENTION

The invention has been made in view of the above problems, and it is an object of the invention to provide an intermediate frequency circuit for a television tuner in which feedback coupling is performed between the input and output of an intermediate frequency amplifier, and a picture portion and a peak level in a frequency characteristic are identical to each other.

In order to achieve the above object, an intermediate frequency circuit for a television tuner according to the invention includes an intermediate frequency tuning circuit, a N−1 channel trap circuit, an intermediate frequency amplifier, and an intermediate frequency signal resonance circuit. The intermediate frequency tuning circuit has a coil and a capacitor connected parallel to each other and resonates parallel to an intermediate frequency signal. The N−1 channel trap circuit is connected to the output of the intermediate frequency tuning circuit and removes voice signal components of lower neighboring channels. The N−1 channel trap circuit includes a coil and a capacitor connected parallel to each other. The intermediate frequency amplifier is connected to the output of the N−1 channel trap circuit and amplifies the intermediate frequency signal. The intermediate frequency signal resonance circuit is connected to the output of the intermediate frequency amplifier and includes a coil and a capacitor connected in series. At this time, all the components are formed on a circuit board. The intermediate frequency circuit further includes constitution means for selecting the coupling state of the components connected between the input and output of the intermediate frequency amplifier on the circuit board and setting a picture portion in a frequency characteristic of the intermediate frequency circuit to a peak.

In this case, in the disposition of the components between the input and output of the intermediate frequency amplifier, the coil of the N−1 channel trap circuit and the coil of the intermediate frequency signal resonance circuit may be air core coils, and the feedback amount between the input and output of the intermediate frequency amplifier is set according to the amount of the induction coupling, which is generated between the two air core coils.

Further, in this case, in the disposition of the components between the input and output of the intermediate frequency amplifier, the coil of the N−1 channel trap circuit may be an air core coil and the coil of the intermediate frequency signal resonance circuit may be a chip-type coil. Furthermore, the input and output of the intermediate frequency amplifier may be disposed parallel, and the feedback amount between the input and output of the intermediate frequency amplifier is set according to a capacitance value of a capacitor connected between the input and output of the intermediate frequency amplifier.

DESCRIPTION OF THE PREFERRED EMBODIMENT

Preferred embodiments of the invention will now be described with reference to the drawings.

Figure 1:
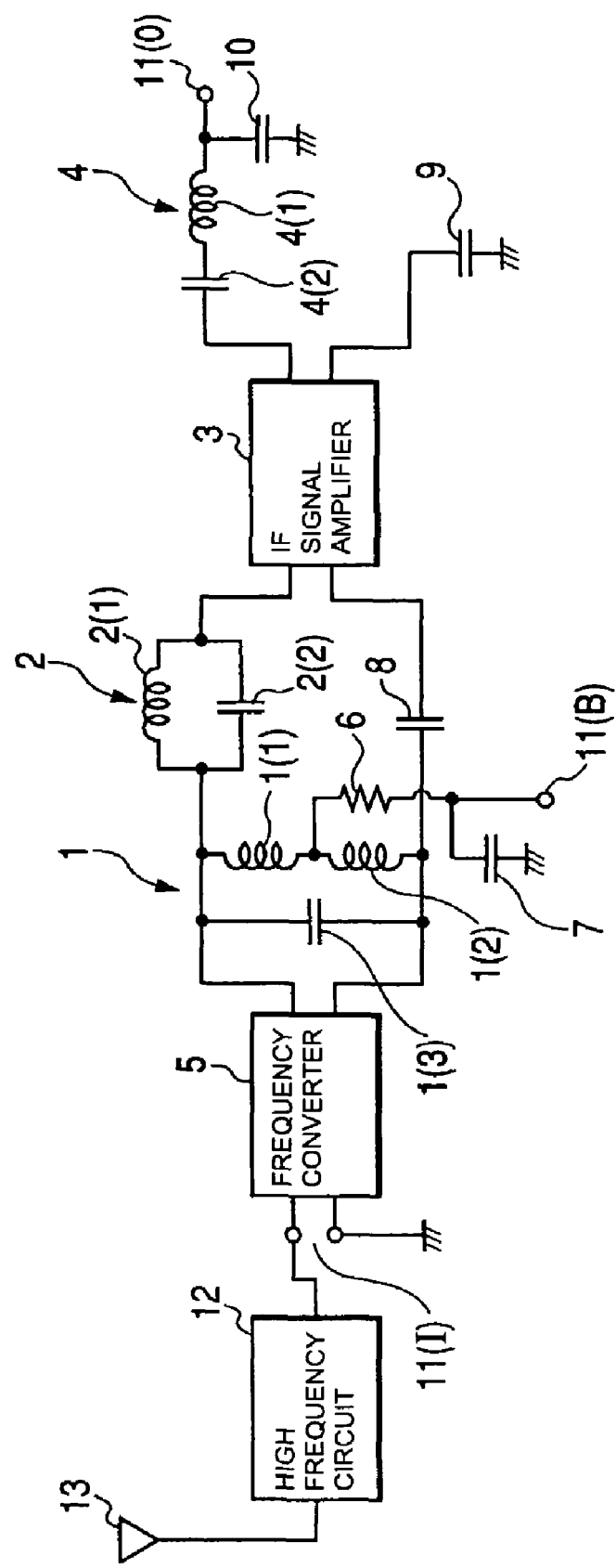
FIG. 1 is a circuit diagram illustrating the construction of an intermediate frequency circuit for a television tuner according to a first embodiment of the invention.
Figure 2:
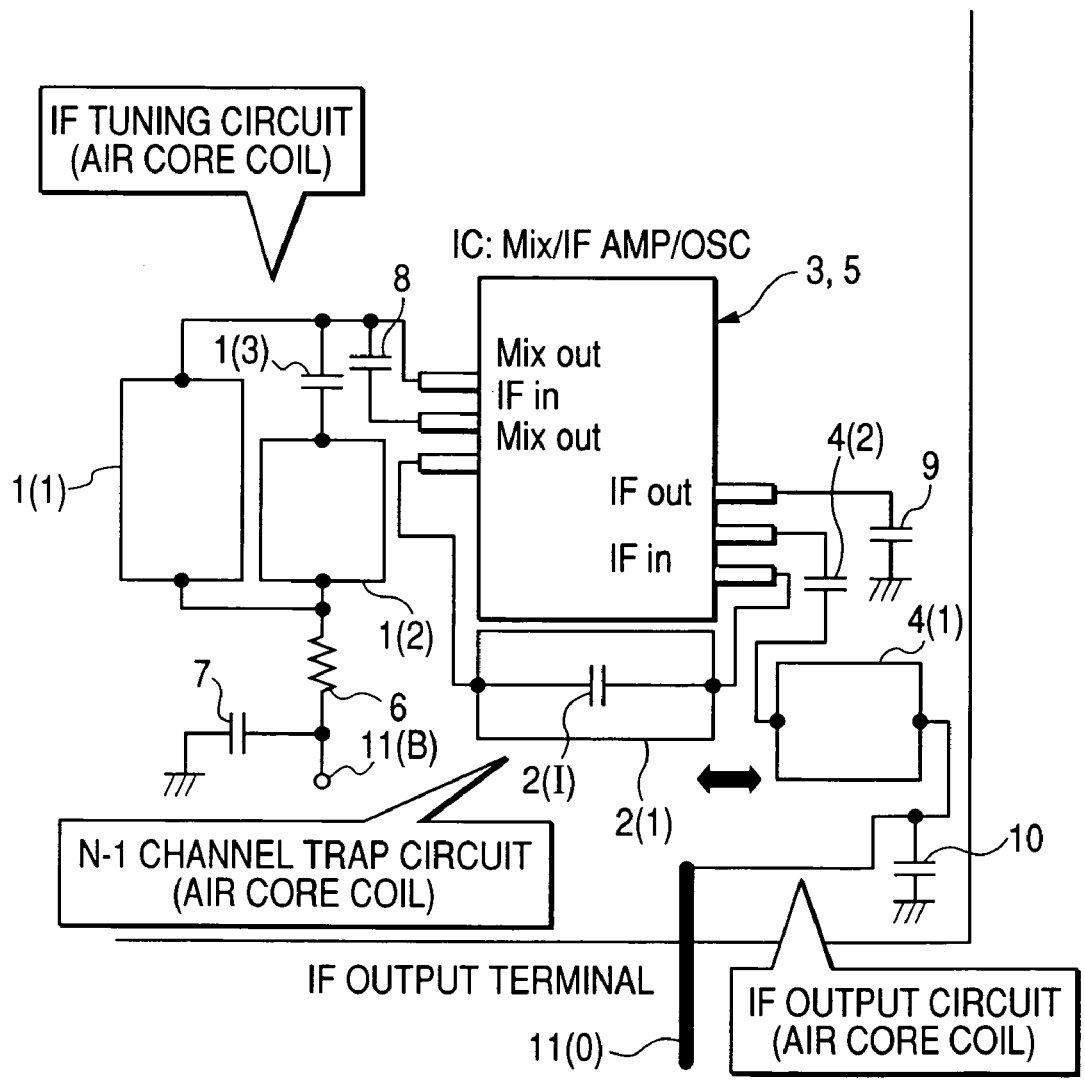
FIG. 2 is a plan view illustrating the disposition state of main components when the intermediate frequency circuit for the television tuner shown in FIG. 1 is formed on a circuit board.

FIG. 1 is a circuit diagram illustrating the construction of an intermediate frequency circuit for a television tuner according to a first embodiment of the invention, including a front part circuit. Furthermore, FIG. 2 is a plan view illustrating the disposition state of main components when the intermediate frequency circuit for the television tuner shown in FIG. 1 is formed on a circuit board. In addition, even in this case, the same reference numerals as in the components shown in FIG. 1 denote the same components of FIG. 2 in the description below.

Figure 7:
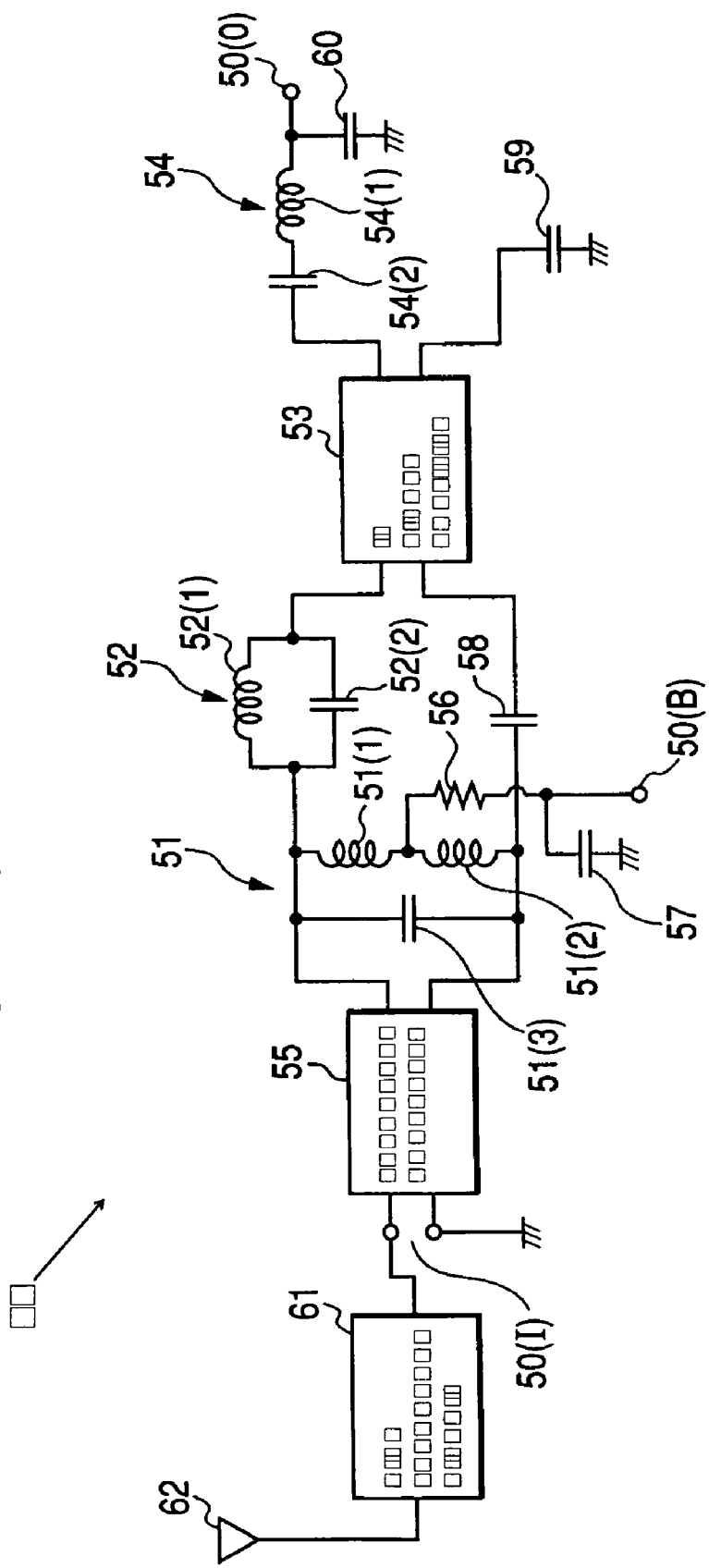
FIG. 7 is a circuit diagram illustrating an exemplary construction of an intermediate frequency circuit for a television tuner according to a related art.
Figure 8:
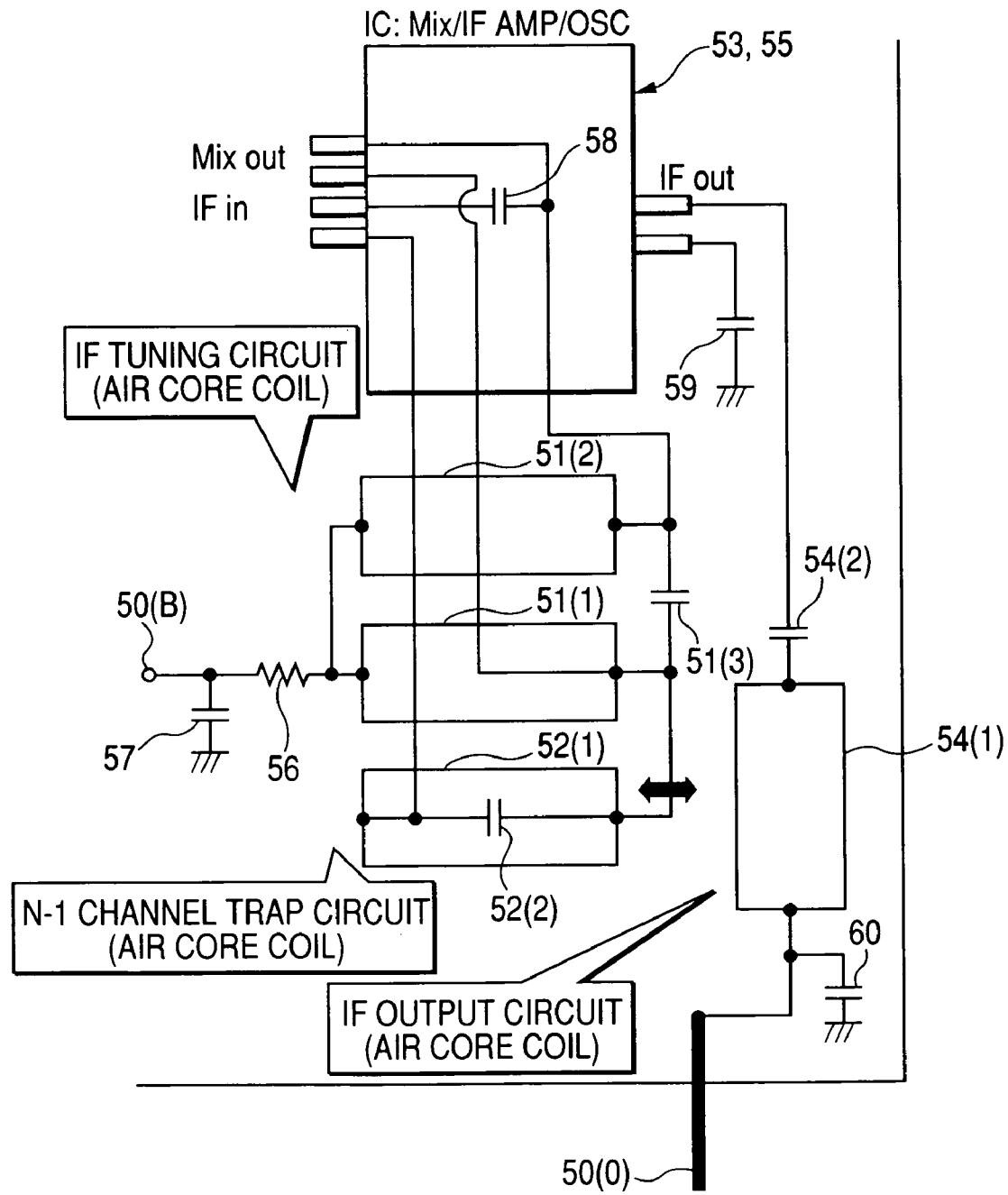
FIG. 8 is a plan view illustrating the disposition state of main components when the intermediate frequency circuit for the television tuner shown in FIG. 7 is formed on a circuit board.
Figure 9A:
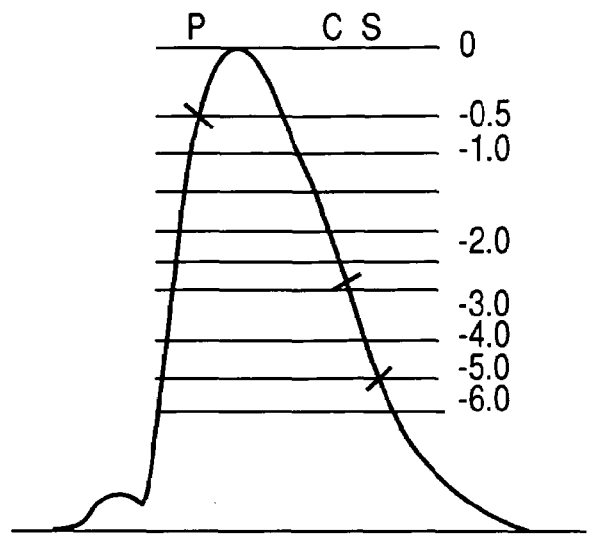
FIGS. 9A and 9B show characteristics obtained in the intermediate frequency circuit for the television tuner shown in FIGS. 7 and 8.
Figure 9B:
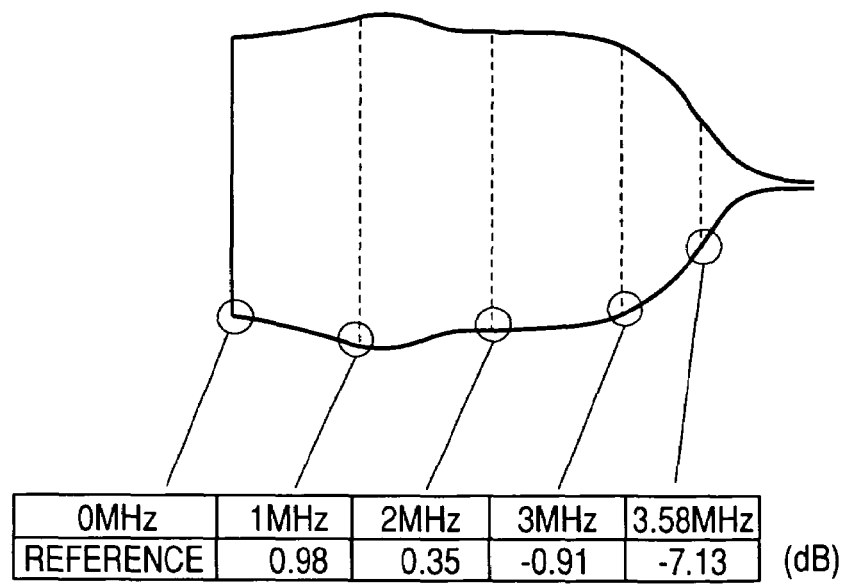

As shown in FIG. 1, the intermediate frequency circuit 11 of the television tuner according to the first embodiment includes an intermediate frequency tuning circuit 1 in which two coils 1(1) and 1(2) connected in series are connected parallel to a capacitor 1(3), a N−1 channel trap circuit 2 in which a coil 2(1) is connected parallel to a capacitor 2(2), an intermediate frequency signal amplifier 3, an intermediate frequency signal resonance circuit 4 in which a coil 4(1) and a capacitor 4(2) are connected in series, a frequency converter 5 including a mixer circuit and a local oscillation circuit, a buffer resistor 6, a bypass capacitor 7, a coupling capacitor 8, a bypass capacitor 9, a shunt capacitor 10, an input terminal 11(I), an output terminal 11(O), and a power supply terminal 11(B). These components 1 to 10 are interconnected, as shown in FIG. 1. The circuit configuration is the same as the intermediate frequency circuit for a television tuner according to the related art shown in FIG. 7 in appearance. Furthermore, the front part circuit of the intermediate frequency circuit 11 of the television tuner includes a high frequency circuit 12 having a bandpass filter, a high frequency amplifier, a television signal select filter or the like, and a reception antenna 13, both of which are connected, as shown in FIG. 1. This configuration of the front part circuit is the same as that of the intermediate frequency circuit for the television tuner according to the related art, shown in FIG. 7.

Furthermore, as shown in FIG. 2, in the disposition state of the respective components when the intermediate frequency circuit 11 of the television tuner according to the first embodiment is formed on the circuit board, an integrated circuit block 3,5 of the intermediate frequency signal amplifier 3 and the frequency converter 5 is disposed at the central region of the board. The integrated circuit block 3,5 has two mixer output terminals (Mix out) and one intermediate frequency input terminal (IF in) that are derived from one side of the block, and two intermediate frequency output terminals (IF out) and one intermediate frequency input terminal (IF in) that are derived from another side opposite to the one side. The two coils 1(1) and 1(2) are disposed in parallel along the one side of the integrated circuit block 3,5. The coil 2(1) is disposed along a side orthogonal to the one side. The coil 4(1) is also cascaded to the coil 2(1). Furthermore, the two coils 1(1) and 1(2) each have one end connected to the capacitor 1(3) therebetween and the other end directly connected to each other by a lead, thus forming the intermediate frequency tuning circuit 1. The coil 2(1) has both ends connected to the capacitor 2(2) therebetween, thus forming the N−1 channel trap circuit 2. The coil 4(1) is connected to the capacitor 4(2) in series, thus forming the intermediate frequency signal resonance circuit 4. In addition, the respective components 6 to 10 are connected, as shown in FIG. 2, and the intermediate frequency circuit 11 of the television tuner is constructed.

As described above, in the intermediate frequency circuit 11 of the television tuner shown in FIGS. 1 and 2 according to the first embodiment, the coil 2(1) of the N−1 channel trap circuit 2 and the coil 4(1) of the intermediate frequency signal resonance circuit 4 are coaxially cascaded to each other. In the integrated circuit block 3,5, the one intermediate frequency input terminal (IF in) and the two intermediate frequency output terminals (IF out) are derived on the same side of the integrated circuit block 3,5. Due to this, some induction coupling is generated between the coil 2(1) and coil 4(1). Capacitance coupling is also generated due to minute capacitance formed between one hot-side intermediate frequency input terminal and one hot-side intermediate frequency output terminal. Some feedback is performed between the input and output of the intermediate frequency amplifier 3 due to the induction coupling and the capacitance coupling.

Figure 3A:
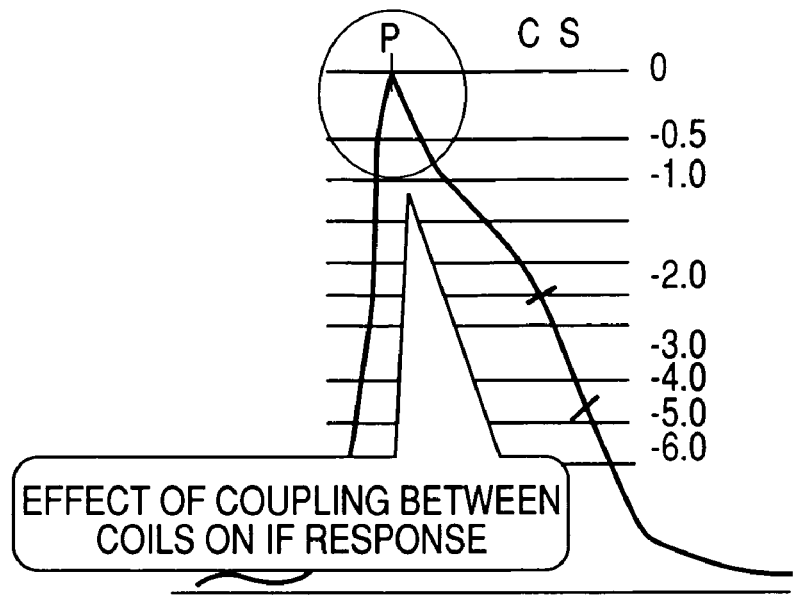
FIGS. 3A and 3B show characteristics obtained in the intermediate frequency circuit for the television tuner according to the first embodiment shown in FIGS. 1 and 2.
Figure 3B:
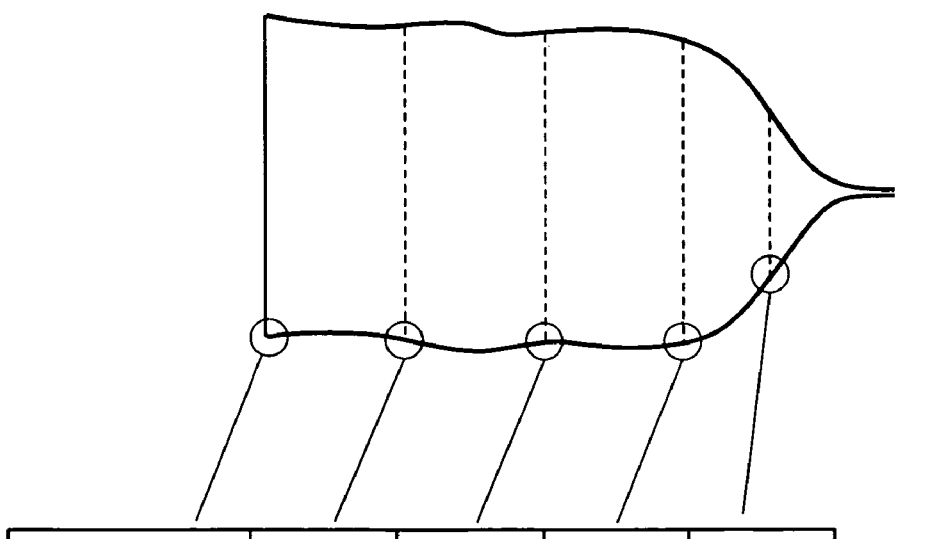

In this case, FIGS. 3A and 3B show characteristics obtained in the intermediate frequency circuit for the television tuner shown in FIGS. 1 and 2 according to the first embodiment. FIG. 3A shows a frequency characteristic and FIG. 3B shows a video frequency characteristic.

As shown in FIGS. 3A and 3B, in the intermediate frequency circuit for the television tuner, some feedback is carried out between the input and output of the intermediate frequency amplifier 3. Therefore, it can be seen from the frequency characteristic of FIG. 3A that there is a portion where a peak level is approximately identical to a picture (P) portion and the level of the picture (P) portion is the peak level. It can also be seen from the video frequency characteristic of FIG. 3B that a portion near 1 MHz, which rises from a reference level of 0 MHz, has been prevented, and a portion near 3.58 MHz, which abruptly declines, has been prevented, so that the video frequency characteristic is generally flat.

Figure 4:
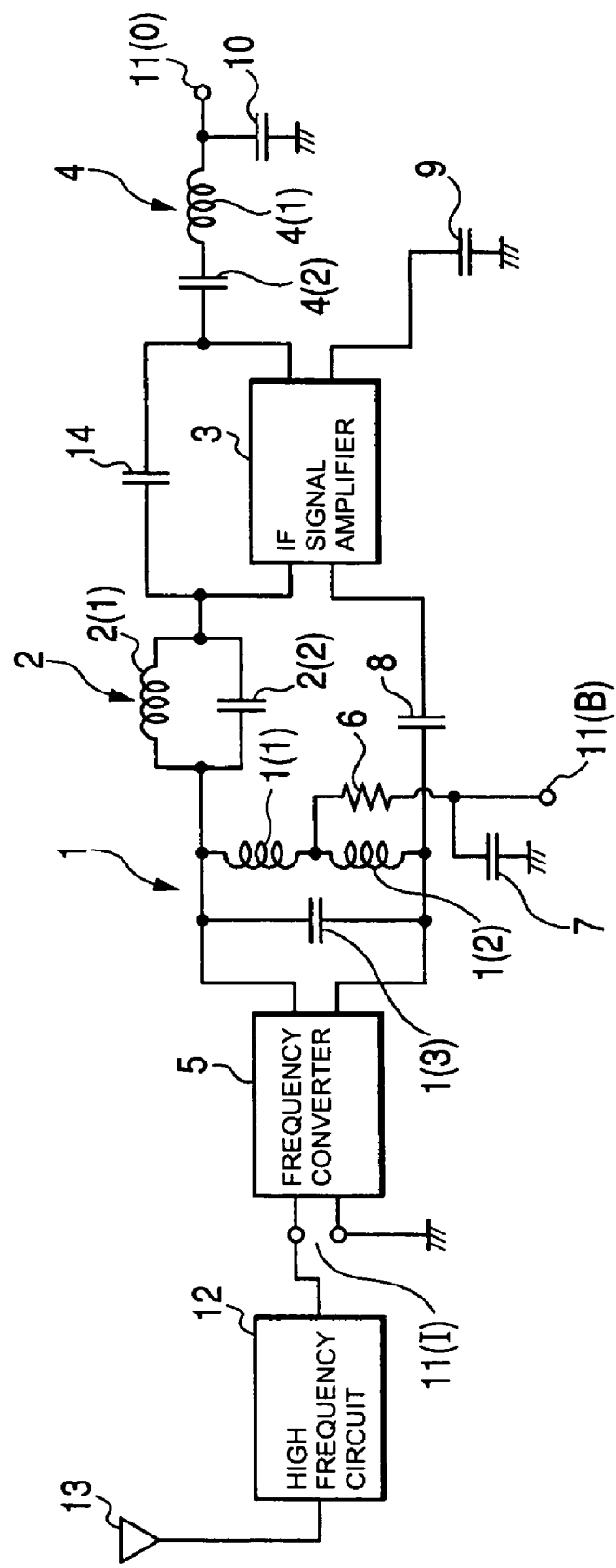
FIG. 4 is a circuit diagram illustrating the construction of an intermediate frequency circuit for a television tuner according to a second embodiment of the invention.
Figure 5:
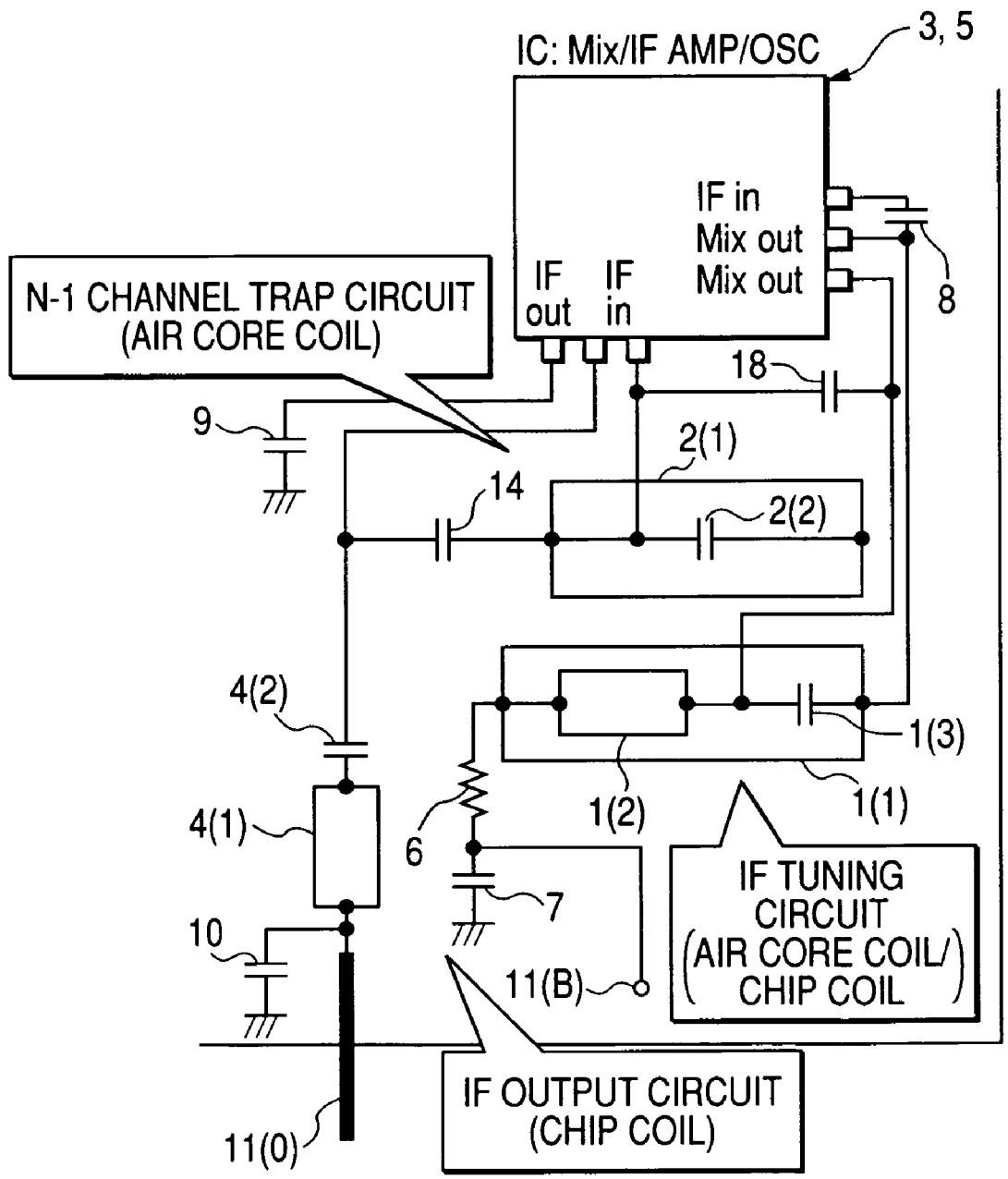
FIG. 5 is a plan view illustrating the disposition state of main components when the intermediate frequency circuit for the television tuner shown in FIG. 4 is formed on a circuit board.

Thereafter, FIG. 4 is a circuit diagram illustrating an intermediate frequency circuit for a television tuner according to a second embodiment of the invention, including a front part circuit. Furthermore, FIG. 5 is a plan view illustrating the disposition state of main components when the intermediate frequency circuit for the television tuner shown in FIG. 4 is formed on a circuit board. In addition, even in this case, the same reference numerals as in the components shown in FIG. 4 denote the same components of FIG. 5 in the description below.

The intermediate frequency circuit for the television tuner shown in FIG. 1 according to the first embodiment (hereinafter, referred to as "the former") is different from the intermediate frequency circuit for the television tuner shown in FIG. 4 according to the second embodiment (hereinafter, referred to as "the latter") in that in the latter, a feedback capacitor 14 is connected between the input and output of an intermediate frequency amplifier 3, whereas in the former, the feedback capacitor 14 is not provided. There is no difference between the former and the latter in the components of the circuit including the front part circuit, except for the above element. For this reason, the same reference numerals as in the former will denote the same components of the latter and the description thereof will be omitted.

Furthermore, as shown in FIG. 5, in the disposition state of the respective components when the intermediate frequency circuit 11 of the television tuner according to the second embodiment is formed on the circuit board, an integrated circuit block 3,5 of the intermediate frequency signal amplifier 3 and a frequency converter 5 is disposed at the central region of the board. The integrated circuit block 3,5 has one intermediate frequency input terminal (IF in) and one intermediate frequency output terminal (IF out) that are derived from one side of the block, and two mixer output terminals (Mix out) and one intermediate frequency input terminal (IF in) that are derived from another side orthogonal to the one side. Two coils 1(1) and 2(1) are disposed in parallel along one side of the integrated circuit block 3,5. Furthermore, the intermediate frequency circuit 11 of the television tuner according to the second embodiment uses a chip coil in each coil 1(2) and coil 4(1). The chip coil 1(2) has one end connected to one mixer output terminal (Mix out) of the integrated circuit block 3,5, one end of a capacitor 1(3) and one end of a coupling capacitor 8, and the other end connected to the other end of the coil 1(1). The chip coil 4(1) has one end connected to one end of a capacitor 4(2) and the other end connected to an output terminal 11(O). The feedback capacitor 14 is connected between the hot-side intermediate frequency input terminal (IF in) and the hot-side intermediate frequency output terminal (IF out) of the integrated circuit block 3,5. In this case, the capacitor 1(3) is connected between both ends of the one coil 1(1) and the one chip coil 1(2) connected in series, thus forming the intermediate frequency tuning circuit 1. The coil 2(1) has both ends connected to a capacitor 2(2), thus forming the N−1 channel trap circuit 2. The coil 4(1) is connected in series to a capacitor 4(2), thus forming the intermediate frequency signal resonance circuit 4. In addition, the respective components 6 to 10 are connected, as shown in FIG. 5, and the intermediate frequency circuit 11 of the television tuner is constructed.

As described above, in the intermediate frequency circuit 11 of the television tuner shown in FIGS. 4 and 5 according to the second embodiment, one intermediate frequency input terminal (IF in) and one intermediate frequency output terminal (IF out) in the integrated circuit block 3,5 are derived on the same side of the integrated circuit block 3,5. The feedback capacitor 14 is connected between the intermediate frequency input terminal and the intermediate frequency output terminal. Capacitance coupling is generated due to minute capacitance generated between the hot-side intermediate frequency input terminal and the hot-side intermediate frequency output terminal, and the feedback capacitor 14 connected between them, and thus some feedback is carried out between the input and output of the intermediate frequency amplifier 3.

Figure 6A:
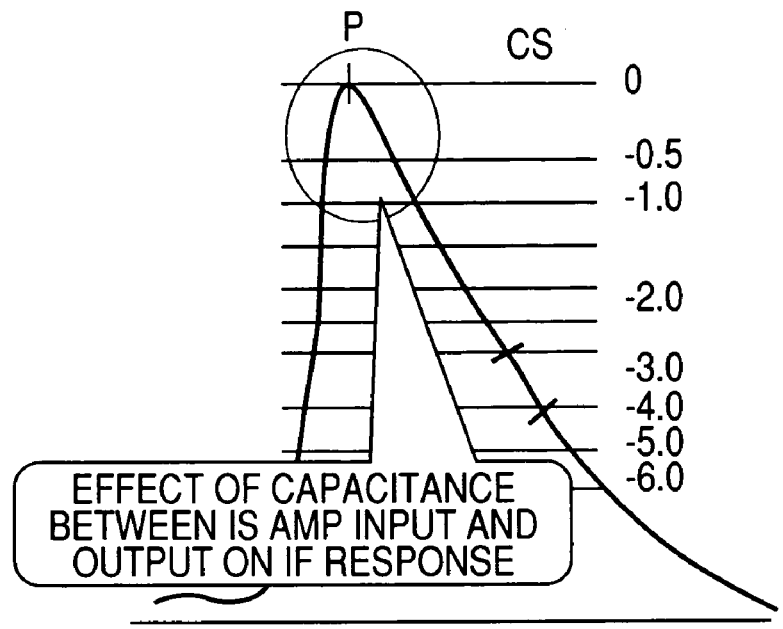
FIGS. 6A and 6B show characteristics obtained in the intermediate frequency circuit for the television tuner according to the first embodiment shown in FIGS. 4 and 5.
Figure 6B:
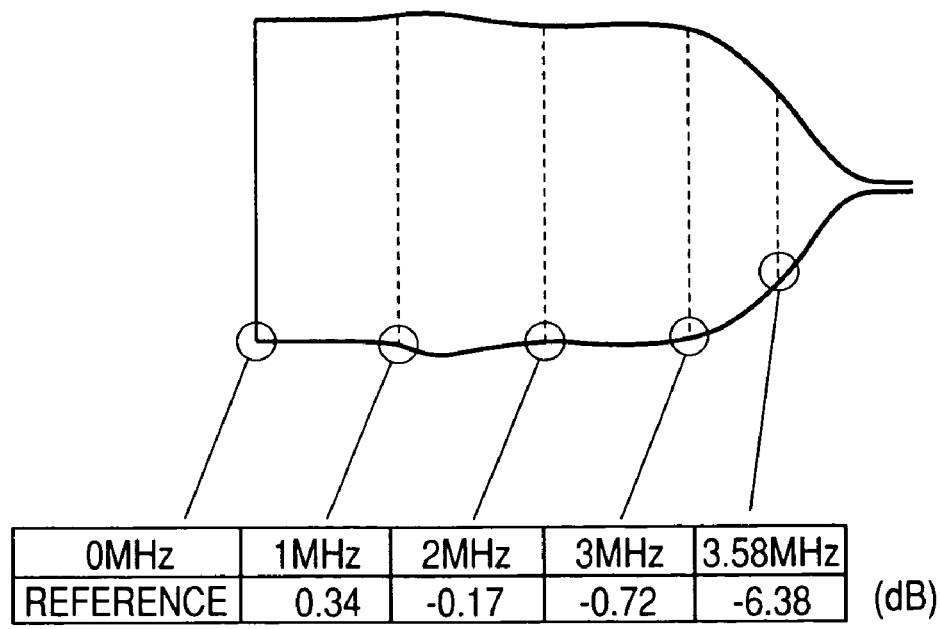

FIGS. 6A and 6B show characteristics obtained in the intermediate frequency circuit for the television tuner shown in FIGS. 4 and 5 according to the second embodiment. FIG. 6A shows a frequency characteristic and FIG. 6B shows a video frequency characteristic.

As shown in FIGS. 6A and 6B, in the intermediate frequency circuit for the television tuner, some feedback is performed between the input and output of the intermediate frequency amplifier 3. Therefore, it can be seen from the frequency characteristic shown in FIG. 6A that there is a portion where a peak level is approximately identical to a picture (P) portion and the level of the picture (P) portion is the peak level. It can also be seen from the video frequency characteristic shown in FIG. 6B that a portion near 1 MHz, which rises from the reference level of 0 MHz, has been prevented, and a portion near 3.58 MHz, which abruptly declines, has been prevented, so that the video frequency characteristic is generally flat.

As described above, according to the intermediate frequency circuit for the television tuner in accordance with the invention, some feedback is performed between the input and output of the intermediate frequency amplifier 3. Accordingly, a frequency characteristic and a video frequency characteristic can be improved and desired characteristics can be obtained through a simple circuit configuration.

Furthermore, as described above, according to an intermediate frequency circuit for a television tuner in accordance with the invention, the coupling state of components disposed between the input and output of an intermediate frequency amplifier on a circuit board is selected. A picture portion in a frequency characteristic of the intermediate frequency circuit is highlighted so that it is identical to the peak level. Accordingly, there are effects in that a picture portion of a frequency characteristic can be enhanced and a video frequency characteristic can be relatively made flat.

The invention claimed is:

1. An intermediate frequency circuit for a television tuner, comprising:
    an intermediate frequency tuning circuit, which has a coil and a capacitor connected parallel to each other and resonates parallel to an intermediate frequency signal;
    an N-1 channel trap circuit connected to an output of the intermediate frequency tuning circuit and having a coil and a capacitor connected parallel to each other, for removing voice signal components of lower neighboring channels;
    an intermediate frequency amplifier connected to an output of the N-1 channel trap circuit, for amplifying the intermediate frequency signal; and
    an intermediate frequency signal resonance circuit, which is connected to an output of the intermediate frequency amplifier and has a coil and a capacitor connected in series, all components being formed on a circuit board,
    wherein a coupling state of components connected between the input and output of the intermediate frequency amplifier on the circuit board is selected, and a picture portion in a frequency characteristic of the intermediate frequency circuit is set to a peak.

2. The intermediate frequency circuit for a television tuner according to claim 1, wherein in the disposition of the components between the input and output of the intermediate frequency amplifier, the coil of the N-1 channel trap circuit and the coil of the intermediate frequency signal resonance circuit are air core coils, and a feedback amount between the input and output of the intermediate frequency amplifier is set according to an amount of induction coupling, which is generated between the two air core coils.

3. The intermediate frequency circuit for a television tuner according to claim 1, wherein in the disposition of the components between the input and output of the intermediate frequency amplifier, the coil of the N-1 channel trap circuit is an air core coil and the coil of the intermediate frequency signal resonance circuit is a chip-type coil, the input and output of the intermediate frequency amplifier are disposed parallel, and feedback amount between the input and output of the intermediate frequency amplifier is set according to a capacitance value of a capacitor connected between the input and output of the intermediate frequency amplifier.

* * * * *